United States Patent
Chen et al.

(10) Patent No.: US 9,974,163 B2
(45) Date of Patent: May 15, 2018

(54) MINIATURE HIGH DENSITY OPTO-ELECTRONIC PACKAGE

(71) Applicant: Futurewei Technologies, Inc., Plano, TX (US)

(72) Inventors: Morgan Chen, San Jose, CA (US); Rongsheng Miao, San Jose, CA (US); Xueyan Zheng, Andover, MA (US); Bo Li, Sunnyvale, CA (US); Xiao Shen, San Bruno, CA (US); Yu Sheng Bai, Los Altos Hills, CA (US)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 613 days.

(21) Appl. No.: 13/729,518

(22) Filed: Dec. 28, 2012

(65) Prior Publication Data
US 2014/0185253 A1  Jul. 3, 2014

(51) Int. Cl.
*H05K 1/09* (2006.01)
*H05K 1/02* (2006.01)
(Continued)

(52) U.S. Cl.
CPC .......... *H05K 1/0274* (2013.01); *H05K 3/361* (2013.01); *G02B 6/4274* (2013.01);
(Continued)

(58) Field of Classification Search
CPC ........ H05K 1/092; H05K 1/095; H05K 1/097; H05K 3/323; H05K 3/321; H05K 2203/0278
(Continued)

(56) References Cited

U.S. PATENT DOCUMENTS 7,139,060 B2   11/2006  Cheng et al.
7,271,461 B2 *  9/2007  Dutta ................. G02B 6/12002
                                                    257/432
(Continued)

FOREIGN PATENT DOCUMENTS

CN    101272679 A    9/2008
CN    101819495 A    9/2010

OTHER PUBLICATIONS

Foreign Communication From a Counterpart Application, PCT Application No. PCT/CN2013/090706, International Search Report dated Mar. 27, 2014, 7 pages.
(Continued)

*Primary Examiner* — Binh Tran
(74) *Attorney, Agent, or Firm* — Futurewei Technologies, Inc.

(57) ABSTRACT

A method comprising coupling a circuit to an opto-electronic package via an anisotropic conductive film (ACF), wherein the opto-electronic package is configured to communicate electrical signals via the coupling at a maximum frequency of about 10 gigahertz (GHz) to about 40 GHz. An apparatus comprising, an opto-electronic package comprising a plurality of first electrodes, and a circuit comprising a plurality of second electrodes, wherein at least one of the first electrodes is coupled to at least one of the second electrodes via an ACF, and wherein the opto-electronic package is configured to communicate electrical signals via the coupling at a maximum frequency of about 10 GHz to about 40 GHz.

9 Claims, 9 Drawing Sheets

(51) Int. Cl.
*H05K 3/36* (2006.01)
*H05K 3/32* (2006.01)
*G02B 6/42* (2006.01)

(52) U.S. Cl.
CPC .......... *H05K 1/0219* (2013.01); *H05K 1/092* (2013.01); *H05K 1/095* (2013.01); *H05K 1/097* (2013.01); *H05K 3/321* (2013.01); *H05K 3/323* (2013.01); *H05K 2201/10121* (2013.01); *H05K 2203/0278* (2013.01); *Y10T 29/4913* (2015.01); *Y10T 29/49144* (2015.01)

(58) Field of Classification Search
USPC .......................................... 174/251, 257, 259
See application file for complete search history.

(56) References Cited

U.S. PATENT DOCUMENTS

| | | | | |
|---|---|---|---|---|
| 7,923,488 | B2* | 4/2011 | Xu ......................... | C08G 18/10 428/413 |
| 2001/0046021 | A1* | 11/2001 | Kozuka ..................... | C09J 9/02 349/150 |
| 2007/0012475 | A1* | 1/2007 | Kawaguchi ............ | H05K 3/361 174/255 |
| 2008/0185717 | A1* | 8/2008 | Sasaki .................... | H01L 24/11 257/737 |
| 2008/0232673 | A1 | 9/2008 | Miyauchi | |
| 2010/0139955 | A1 | 6/2010 | Long et al. | |
| 2012/0225197 | A1 | 9/2012 | Ebigase et al. | |

OTHER PUBLICATIONS

Foreign Communication From a Counterpart Application, PCT Application No. PCT/CN2013/090706, Written Opinion dated Mar. 27, 2014, 6 pages.

"ACF Interconnect, Alternative Interconnect for Solder or Mechanical Connect, Electrical Property & Reliability of ACF Interconnect," Conductive Material Division Product Development Section 3, Material Marketing & Sales Department Section 2, Sony Chemical & Information Device Corporation, JK-09-E-017, Jun. 11, 2010, 30 pages.

Yim, M.J., et al., "High Frequency Properties of Anisotropic Conductive Films (ACFs) for Flip Chip Package Applications," Electronic Materials Letters, vol. 2, No. 1, 2006, pp. 7-14.

ACFFilm.com, http://www.acffilm.com, downloaded from the Internet Dec. 18, 2012, 3 pages.

Yim, M.J., et al., "Microwave Model of Anisotropic Conductive Film Flip-Chip Interconnections for High Frequency Applications," IEEE Transactions on Components and Packaging Technology, vol. 22, No. 4, Dec. 1999, pp. 575-581.

* cited by examiner

MINIATURE HIGH DENSITY OPTO-ELECTRONIC PACKAGE

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Electronic packages may comprise a plurality of electrodes which may be coupled to electrodes of other components. Such electrode couplings may be used to interface with the other components. The distance between the electrodes of an electronic package may be referred to as the pin pitch. One method of coupling electronic package electrodes to the electrodes of another component to create a fine pin pitch is a hot bar reflow soldering method, in which components are coated with solder, heated to a temperature sufficient to cause the solder to melt, held in close proximity to allow the solder to flow and mix, and cooled to allow the solder to solidify to form a permanent electro-mechanical bond. The hot bar reflow soldering method may not be useful for electronic packages comprising optical components (opto-electronic packages) because the hot bar reflow method may require a large pin pitch (e.g. greater than 700 micrometers (microns). Other methods, such as an oven reflow process, may heat the entire package, which may result in damage to the optical components.

SUMMARY

In one embodiment, the disclosure includes a method comprising coupling a circuit to an opto-electronic package via an anisotropic conductive film (ACF), wherein the opto-electronic package is configured to communicate electrical signals via the coupling at a maximum frequency of about 40 gigahertz (GHz) to about 10 GHz.

In another embodiment, the disclosure includes an apparatus comprising, an opto-electronic package comprising a plurality of first electrodes, and a circuit comprising a plurality of second electrodes, wherein at least one of the first electrodes is coupled to at least one of the second electrodes via an ACF, and wherein the opto-electronic package is configured to communicate electrical signals via the coupling at a maximum frequency of about 10 GHz to about 40 GHz.

In another embodiment, the disclosure also includes an apparatus comprising an opto-electronic package comprising a plurality of first electrodes, and a circuit comprising a plurality of second electrodes, wherein at least one of the first electrodes is coupled to at least one of the second electrodes via an ACF, and wherein the opto-electronic package comprises a receiver optical sub-assembly (ROSA) or a transmitter optical sub-assembly (TOSA).

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein is a method, apparatus, and or system of coupling an opto-electronic package's electrodes to electrodes of a circuit, such as a flexible printed circuit (FPC), to allow for a fine pin pitch without employing heat. The FPC may be attached to the opto-electronic package via an ACF. The ACF may comprise a dielectric and a plurality of conductive elements which may be constructed in spherical shapes and may be randomly distributed through the dielectric. The ACF may comprise and/or may be coated with an adhesive. The ACF may be positioned between the FPC and the opto-electronic package and compressed until a mechanical bond is created. The conductive elements may then act as an electrical connection between the interface electrodes and the opto-electronic package.

According to general understanding in the art, couplings designed to support high frequency signals (e.g. greater than about ten GHz) are believed to require controlled positioning of conductive elements. Uncontrolled positioning of conductive elements is believed to result in uncontrolled capacitance and/or uncontrolled impedance which may result in poor performance of the coupling when the coupling is utilized to transmit high frequency signals. A person of ordinary skill in the art may be persuaded to believe that the use of ACF (which may comprise uncontrolled conductive elements) to couple an opto-electronic package to an FPC may result in inferior performance and/or a non-operational device. However, as shown herein, ACF may be used as a coupling medium for high frequency opto-electronic packages without negatively impacting device performance.

Figure 1A:
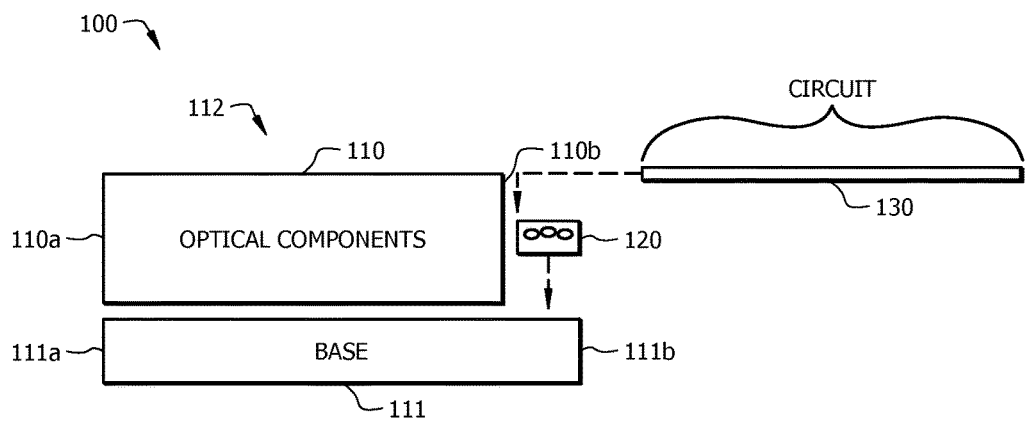
FIG. 1A is a side view of a schematic diagram of an embodiment of an opto-electronic package.

FIG. 1A is a side view of a schematic diagram 100 of an embodiment of an opto-electronic package 112. The opto-electronic package 112 may be coupled to an FPC 130 via an ACF 120. The ACF 120 may be applied to the opto-electronic package 112 and the FPC 130 at low temperatures that may not damage optical components 110. The ACF 120 may conduct electricity and may allow electric signals to pass between the opto-electronic package 112 and the FPC 130, even at high frequencies (e.g. greater than about 10 GHz).

The opto-electronic package 112 may comprise optical components 110. Optical components 110 may receive optical signals from other components and convert the optical signals to electrical signals. For example, optical components 110 may comprise an optical receiver, such as a ROSA, an optical transmitter, such as a TOSA, fiber optic lines, modulators, demodulators, multiplexers, lasers, and/or other components configured for the conversion and/or transmission of opto-electrical signals. Optical components 110 may be sealed in a container, which may be made of metal, may protect the optical components 110 from damage, and may comprise a proximate end 110a and a distal end 110b. The opto-electronic package 112 may further comprise a base 111 which may be affixed to the optical components 110. The base 111 may comprise a ceramic material, may act as an insulator, and may prevent electrical signal shorting. The base 111 may also hermetically seal the opto-electronic package 112 and may prevent contamination of the optical components 110 by external material. The base 111 may also comprise a plurality of conductive traces configured to transmit electrical signals to and/or from any optical components 110, which may be configured to convert electrical signals to optical signals. The base 111 may comprise a proximate end 111a and a distal end 111b. The base distal end 111b may extend beyond the opto-electronic package distal end 110b, as shown in FIG. 1A, which may allow the base 111 to couple with other components.

The opto-electronic package 112 may be electrically coupled to a circuit 130, such as an FPC. In an embodiment, the circuit 130 may be configured to accept electrical signals from the opto-electronic package 112 and forward the electrical signals to other components, such as components configured for electrical signal transmission, (e.g. when the opto-electronic package 112 is a ROSA). In another embodiment, the circuit 130 may be configured to accept electrical signals from other components, such as components configured for electrical signal transmission, and forward the electrical signals to the opto-electronic package 112 for further optical transmission (e.g. when the opto-electronic package 112 is a TOSA). The circuit 130 may comprise a nonconductive material such as plastic and a plurality of conductive traces positioned on the nonconductive material for transmitting signals between the opto-electronic package 112 and the other components.

Figure 1B:
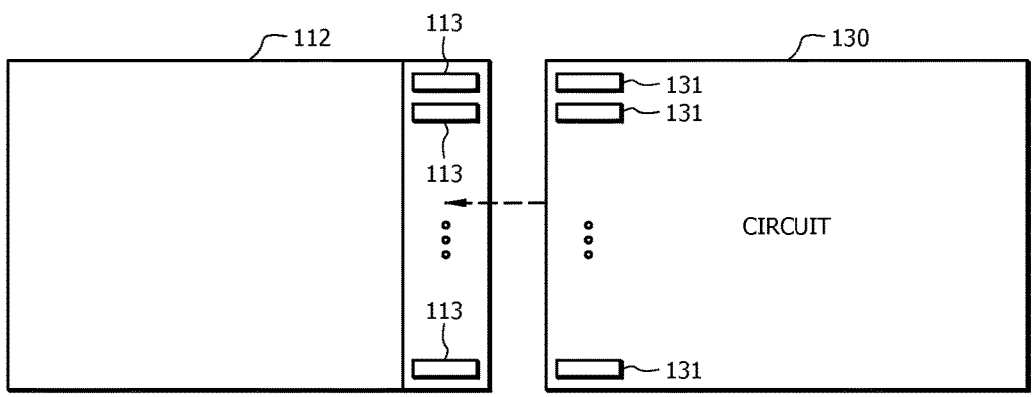
FIG. 1B is a top view of a schematic diagram of an embodiment of an opto-electronic package.

FIG. 1B is a top view of a schematic diagram 100 of an embodiment of an opto-electronic package 112. It should be noted that ACF 120, which is discussed below, has been omitted from FIG. 1B for reasons of clarity. As shown in FIG. 1B, the opto-electronic package 112 may comprise a plurality of electrodes 113. The electrodes 113 may be positioned on the base distal end 111b, may comprise conductive material, and may be coupled to the opto-electronic package 112 conductive traces. The circuit 130 may comprise electrodes 131 which may be configured to correspond to the opto-electronic package electrodes 113, may comprise conductive material, and may be coupled to the circuit 130 conductive traces. The opto-electronic package electrodes 113 may be electrically coupled to the corresponding circuit electrodes 131 to allow electrical signals to pass between the opto-electronic package 112 and the circuit 130.

Referring to FIG. 1A, the opto-electronic package 112 may be coupled to the circuit 130 by an ACF 120. The ACF 120 may be positioned both between electrodes 113 and 131 and may traverse the pin pitch between the electrode connections. The ACF 120 may comprise a dielectric material, such as a resin, and a plurality of conductive elements suspended in the dielectric material. The conductive elements may comprise a diameter of about 10 microns and a substantially spherical shape, a cylindrical shape, or other shapes. The conductive elements may comprise gold (e.g. solid gold or gold plating). The ACF 120 may have a conductive element density of about 800 conductive elements per square millimeter. The conductive elements may be substantially evenly distributed throughout the ACF 120. As indicated by the dashed arrows of FIG. 1A, the circuit 130 may be coupled to the opto-electronic package 112 via the ACF 120 by compressing the ACF 120 between the circuit 130 and the distal end 111b of the base 111. The ACF 120 may comprise and/or may be coated with an adhesive material. The adhesive material may mechanically bond the distal end 111b of the base 111 to the circuit 130 and the conductive elements may electrically couple the opto-electronic package electrodes 113 to the corresponding circuit electrodes 131, which may allow electrical signals to be communicated between the opto-electronic package 112 conductive traces and the circuit conductive traces 112. In an embodiment, the electrical signals may be direct current signals. In another embodiment, the electrical signals may be alternative current signals and may comprise a maximum frequency of about 0.0001 GHz to about 40 GHz, about 10 GHz to about 40 GHz, about 20 GHz to about 40 GHz, about 30 GHz to about 40 GHz, about 35 GHz to about 40 GHz, about 0.0001 GHz to about 35 GHz, about 10 GHz to about 35 GHz, about 20 GHz to about 35 GHz, about 30 GHz to about 35 GHz, about 0.0001 GHz to about 30 GHz, about 10 GHz to about 30 GHz, about 20 GHz to about 30 GHz, about 0.0001 GHz to about 20 GHz about 10 GHz to about 20 GHz, about 0.0001 GHz to about 20 GHz, or combinations thereof. The electrical signals also comprise a maximum bandwidth of about 10 gigabits per second (Gbps) to about 100 Gbps, about 25 Gbps to about 100 Gbps, about 30 Gbps to about 100 Gbps, about 10 Gbps to about 30 Gbps, about 25 Gbps to about 30, about 10 Gbps to about 25 Gbps, or combinations thereof. The use of ACF 120 to couple the opto-electronic package 112 to the circuit may be beneficial as ACF 120 may allow for a pin pitch of about 10 microns, reduce component size and associated parasitic capacitance effects, and provide consistent mechanical bonding between components. The process of applying ACF 120 may also be cheaper than using hot bar solder, result in higher yields, and result in faster assembly time on a per unit basis.

Referring to FIG. 1B, some methods of coupling electrodes 113 to electrodes 131 may require a minimum pin pitch (e.g. spacing between electrodes 113 and spacing between electrodes 131, respectively) of greater than 700 microns, as coupling smaller pin pitches using these methods may result in unintended electrical shorts between electrodes during the manufacturing process. The use of ACF 120 as a coupling medium may reliably allow pin pitches of about 10 microns to about 700 microns, about 30 microns to about 700 microns, about 50 microns to about 700 microns, about 235 microns to about 700 microns, about 250 microns to about 700 microns, about 10 microns to about 250 microns, about 30 microns to about 250 microns, about 50 microns to about 250 microns, about 235 microns to about 250 microns, about 10 microns to about 235 microns, about 30 microns to about 235 microns, about 50 microns to about 235 microns, about 10 microns to about 50 microns, about 30 microns to about 50 microns, about 10 microns to about 30 microns, or combinations thereof.

Figure 2:
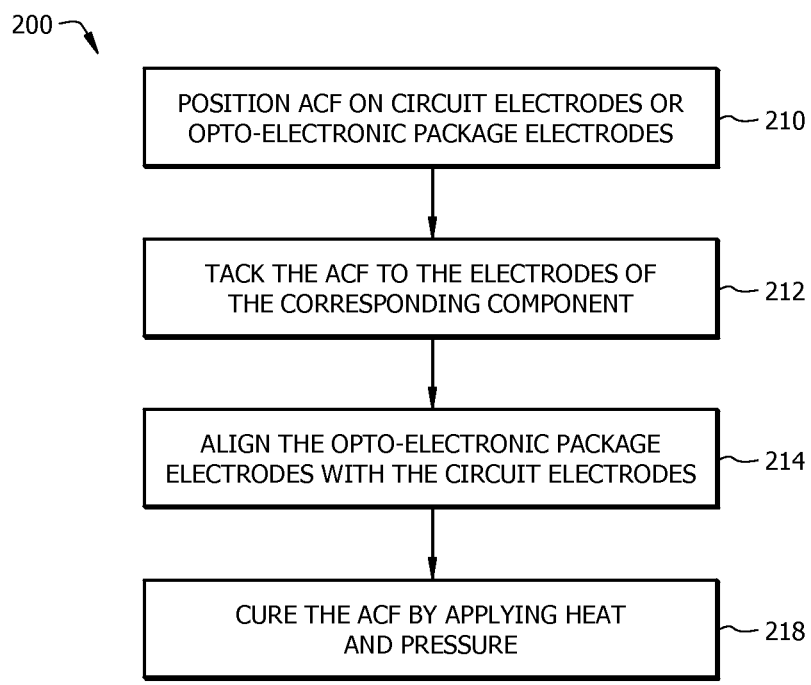
FIG. 2 is a flowchart of a method of coupling an opto-electronic package to a circuit.

FIG. 2 is a flowchart of a method 200 of coupling an opto-electronic package to a circuit. At block 210, an ACF (e.g. ACF 120) may be positioned on circuit electrodes (e.g. electrodes 131) or on opto-electronic package electrodes (e.g. electrodes 113). At block 212, the ACF may be tacked to the electrodes of the corresponding component. For example, if the ACF is applied to the opto-electronic package electrodes in block 210, the ACF may be tacked to the circuit electrodes in block 212 and vice versa. Tacking may comprise compressing the ACF between the opto-electronic package and the circuit at low temperature (e.g. about 80° C.) and pressure (e.g. about 1 megapascal (MPa) or less). At block 214, the optoelectronic package electrodes may be aligned with the circuit electrodes, for example by using mechanical pressure while the electrode alignment is observed under a microscope. At block 218, the ACF may be cured by applying heat and pressure, for example about 180° C. and a pressure in the range of about 1 MPa to about 3 MPa, respectively. The curing process may result in a permanent mechanical bond between the opto-electronic package base (e.g. base 111) and the circuit (e.g. circuit 130).

Figure 3:
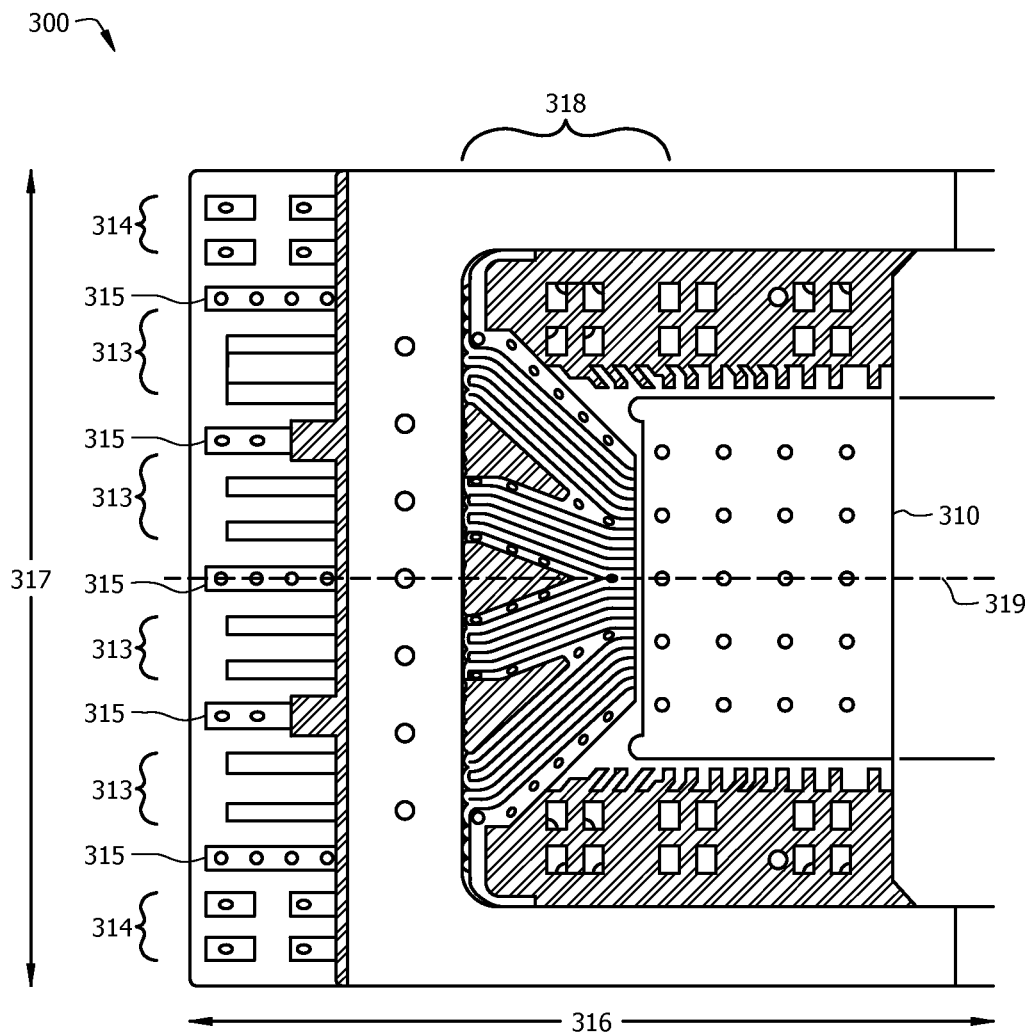
FIG. 3 is a schematic diagram of an embodiment of portion of an opto-electric package.

FIG. 3 is a schematic diagram of an embodiment of a portion of an opto-electric package 300. Opto-electric package 300 may be configured to be coupled to a circuit using traditional electrode spacing constraints. Opto-electric package 300 may comprise an optical components pad 310, which accept optical components such as optical components 110. Optical components pad 310 may be coupled to electrodes 313 via conductive traces 318. Electrodes 313 may be substantially similar to electrodes 113 and may be configured to communicate AC and/or DC electrical signals to the coupled circuit. Opto-electric package 300 may also comprise power electrodes 314 and ground electrodes 315, which may provide power and ground connections, respectively, to the coupled circuit.

As shown in FIG. 3, the minimum electrode spacing of electrodes 313-315 may require conductive traces 318 to fan-out to connect the optical components pad 310 to the electrodes 313. A fan-out may be a configuration of conductive traces, wherein the conductive traces are not positioned substantially in parallel. Opto-electric package 300 may comprise a central axis 319, and conductive traces 318 may positioned at an angle of about forty five degrees or less with respect to the central axis 319. An angle of greater than forty five degrees may result in electrical signal degradation when transmitting high frequency electrical signals. Also, progressively larger angles may result in an electrical phase mismatch between the inner conductive traces 318 and the outer conductive traces 318. As the conductive traces 318 may be constrained to about a forty five degree angle, the length of the conductive traces 318 may be a function of the distance between the most distant conductive trace 318 from the central axis 319. By reducing the pin pitch as discussed in FIG. 1, the fan-out of conductive traces 318 may be reduced or substantially eliminated, which may allow the use of conductive traces that are substantially parallel to the central axis. Opto-electric package 300 may comprise a length 316 and a width 317, which may be about 8.6 millimeters (mm) and 10.5 mm, respectively. Replacing the fan-out of conductive traces 318 with substantially parallel conductive traces may allow the length 316 to be reduced by about 2.15 mm and/or about twenty five percent, which may result in an opto-electric package with smaller electric signal propagation delays. The propagation delays for such substantially parallel conductive traces may also be substantially equal across all conductive traces as substantially parallel conductive traces may comprise substantially similar lengths. Reducing the pin pitch as discussed in FIG. 1 may also allow the width 317 to be reduced from about 10.5 mm to about 6.5 mm and/or about thirty-eight percent.

Figure 4A:
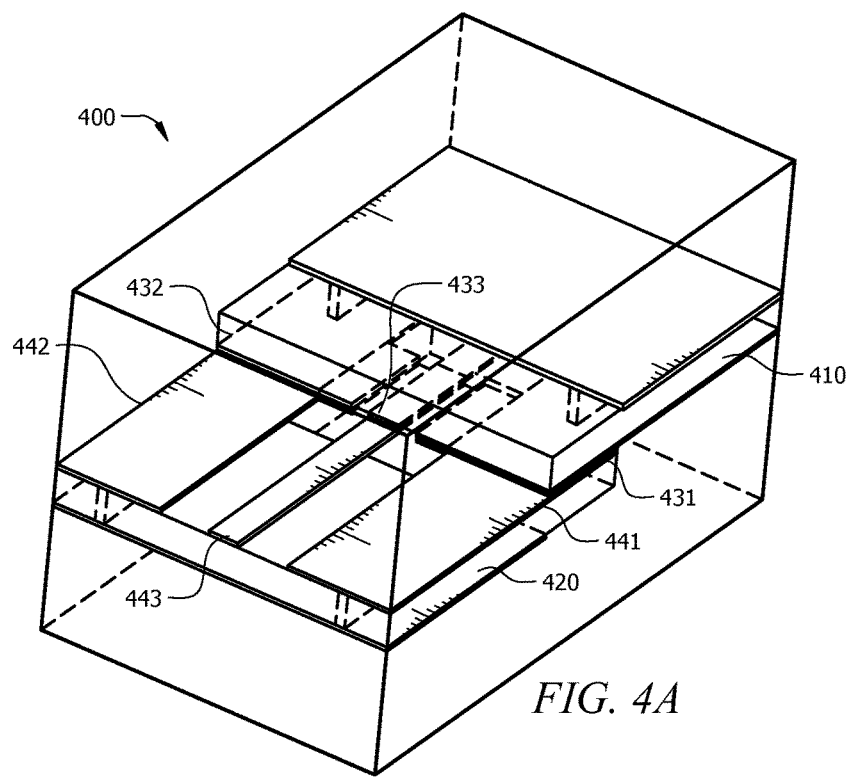
FIGS. 4A-4B are schematic diagrams of embodiments of package couplings.
Figure 4B:
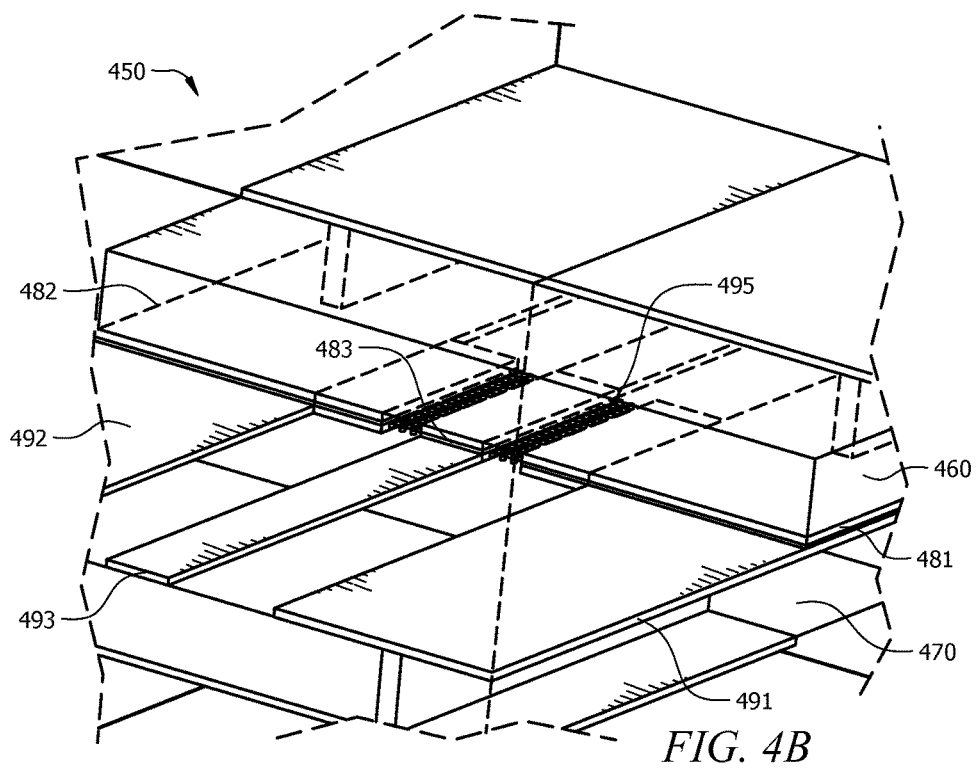
Figure 5A:
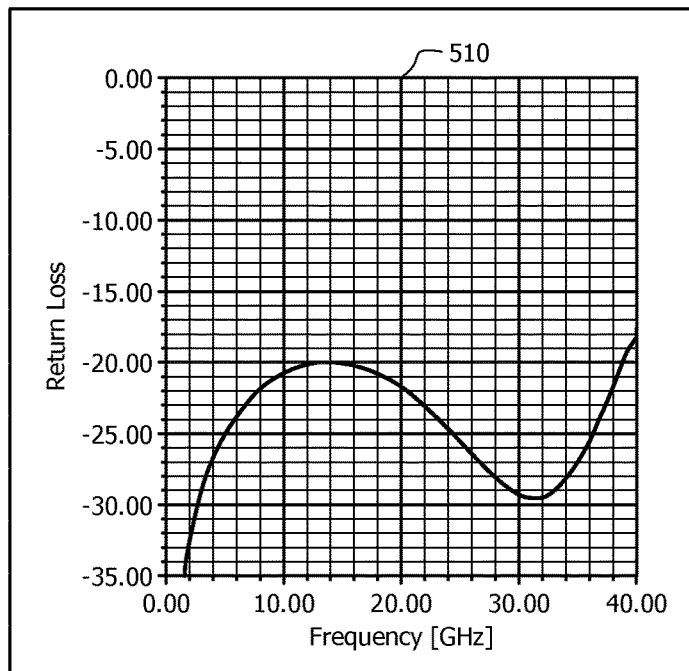
FIGS. 5A-5D are embodiments of graphs of return loss and insertion loss.
Figure 5B:
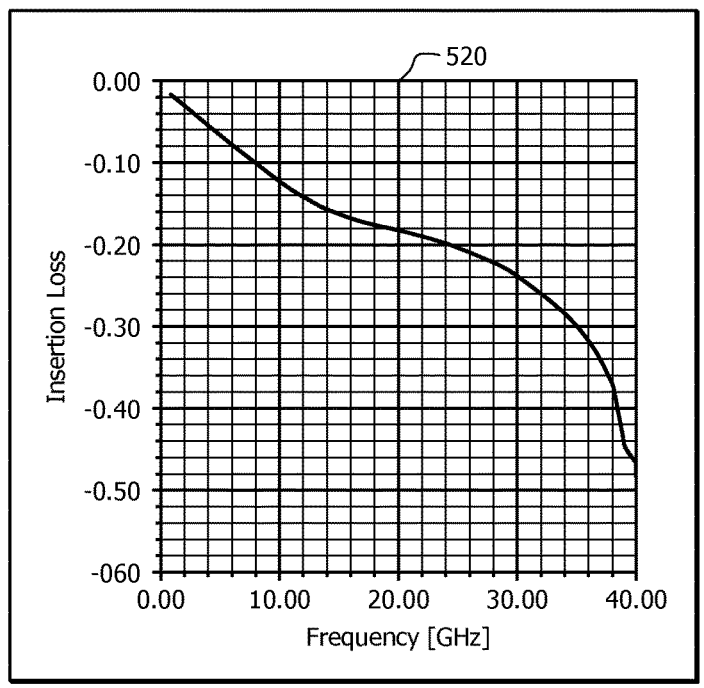
Figure 5C:
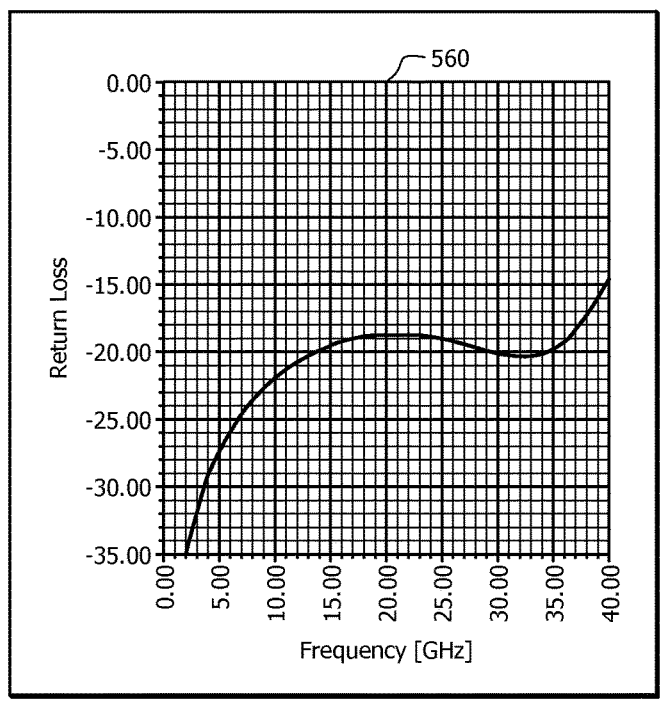
Figure 5D:
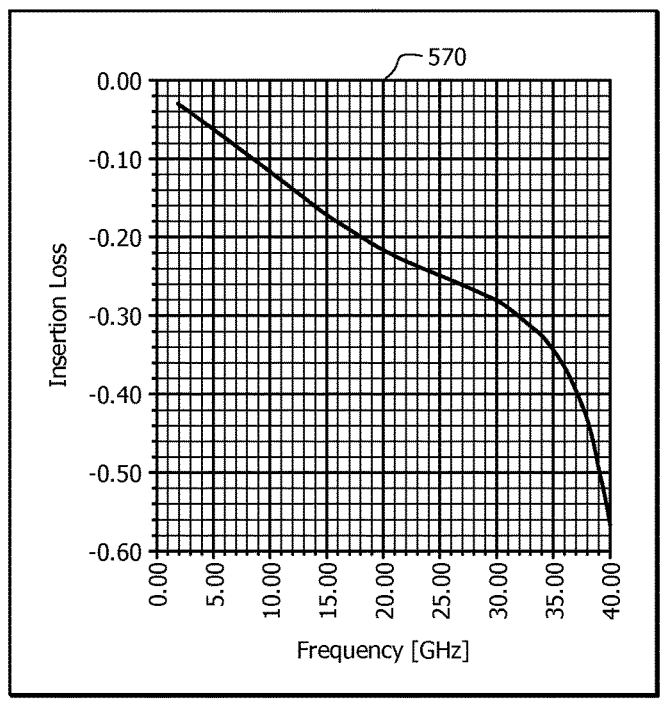

A person of ordinary skill in the art may believe that the use of ACF to couple an opto-electronic package to a circuit may result in a radio frequency (RF) short due to significantly increased capacitance when the coupling is used to transmit high frequency signals. Also, a person of ordinary skill in the art may believe that the substantially uncontrolled positioning of the ACF conductive elements may result in unpredictable performance. FIGS. 4A-4B are schematic diagrams of embodiments of package couplings, where package coupling 400 employs an ideal metal connection and package coupling 450 employs ACF. FIGS. 5A-5D are embodiments of graphs of return loss and insertion loss for package couplings 400 and 450, respectively. FIGS. 4-5 may show that the use of ACF as a coupling medium may result in an operational device.

Referring to FIGS. 4A-4B, package coupling 400 may comprise conductive traces positioned on a first base 410 and a second base 420. Bases 410 and 420 may comprise a ceramic material and may serve a similar function as base 111. Base 410 may comprise ground traces 431 and 432 and a signal trace 433. Base 420 may comprise ground traces 441 and 442 and signal trace 443. Traces 431-433 may be coupled to traces 441-443, respectively, as shown. The couplings between traces 431-433 and 441-443, respectively, may be made via an ideal conductive material (e.g. solder with no deformities) with a thickness of about 10 microns. Package 450 may be substantially similar to package 400, but may comprise ACF 495 instead of the ideal conductive material. Package 450 may comprise bases 460 and 470, ground traces 481-482 and 491-492, and signal traces 483 and 493, which may be substantially similar to bases 410 and 420, ground traces 431-432 and 441-442, and signal traces 433 and 433. The couplings between traces 481-483 and 491-493, respectively, may be made via ACF 495.

Referring to FIGS. 5A-5D, graphs 510 and 560 show the negative return loss of package couplings 400 and 450, respectively, over a plurality of frequencies and graphs 520 and 570 show the negative insertion loss of package couplings 400 and 450, respectively, over a plurality of frequencies. Return loss may be the amount of energy reflected by the coupling at a specified frequency and measured in decibels (dBs). Insertion loss may be the amount of energy received by a first signal trace on a first side of the coupling minus the amount of energy transmitted across a second signal trace on a second side of the coupling and measured in dBs. As shown in graphs 510 and 560, a return loss of package 450 that comprises ACF 495 may be comparable to a return loss of package 400 that comprises a coupling by an ideal conductive material. A return loss of greater than 18 dB may be desirable. As shown in graph 560, package 450 may maintain a return loss of greater than 18 dB while communicating signals of a frequency lower than about 37 GHz. As shown in graphs 520 and 570, an insertion loss of package 450 that comprises ACF 495 may be comparable to an insertion loss of package 400 that comprises a coupling by an ideal conductive material. An insertion loss between zero dB and about 1 dB may be desirable. As shown in graph 570, package 450 may maintain an insertion loss between zero dB and about 0.3 dB while communicating signals of a frequency lower than about 32 GHz. The return loss and insertion loss of package coupling 450 as shown herein may be within a performance range that may be required for transmissions of greater than 25 Gbps.

Figure 6A:
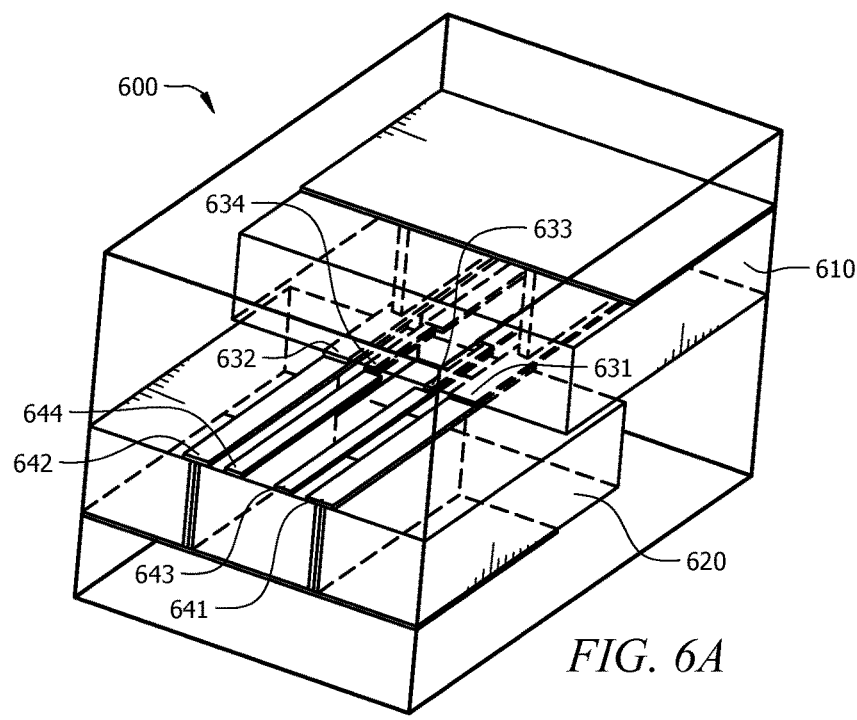
FIGS. 6A-6B are schematic diagrams of further embodiments of package couplings.
Figure 6B:
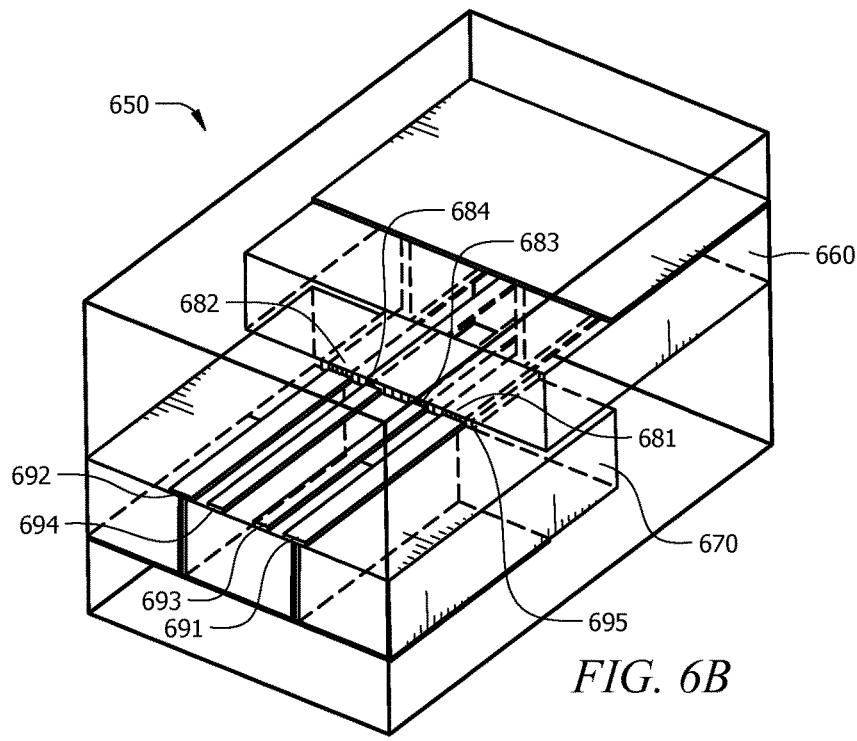
Figure 7A:
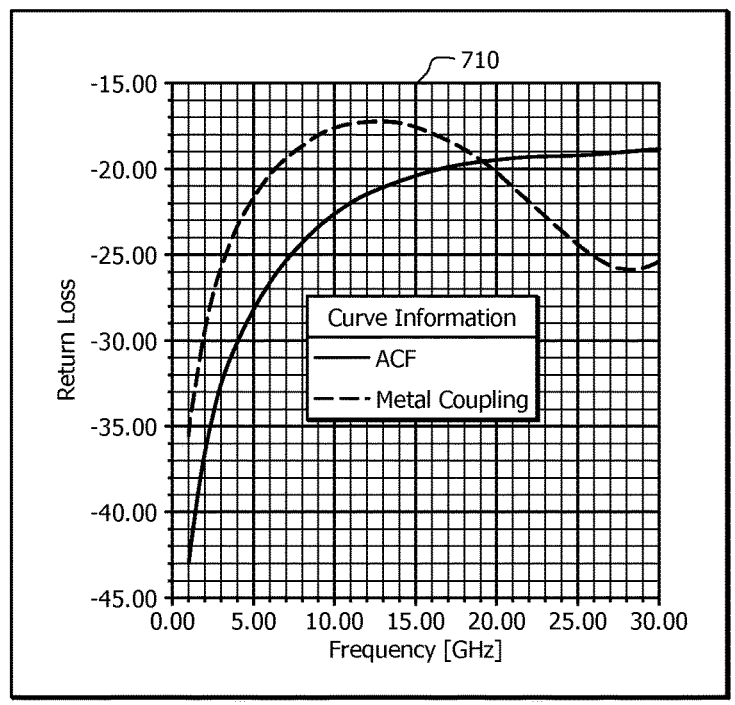
FIGS. 7A-7B are further embodiments of graphs of return loss and insertion loss.
Figure 7B:
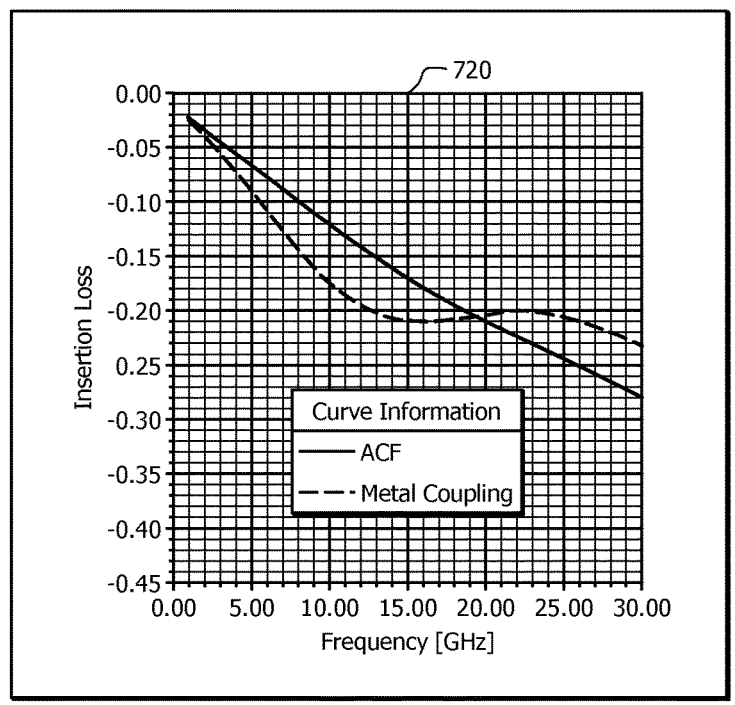

FIGS. 6A-6B are schematic diagrams of further embodiments of package couplings, where package coupling 600 employs an ideal metal connection and package coupling 650 employs ACF. Package couplings 600 and 650 may be substantially similar to package couplings 400 and 450, respectively, but may be configured for differential signaling (e.g. ground, signal, signal ground.) FIGS. 7A-7B are further embodiments of graphs of return loss and insertion loss for package couplings 600 and 650, respectively.

Referring to FIGS. 6A-6B, package coupling 600 may comprise conductive traces positioned on a first base 610 and a second base 620. Bases 610 and 620 may comprise a ceramic material and may serve a similar function as bases 111, 410, and/or 420. Base 410 may comprise ground traces 631-632 and a signal traces 633-634. Base 620 may comprise ground traces 641-642 and signal traces 643-644. Traces 631-634 may be coupled to traces 641-644, respectively, as shown. The couplings between traces 631-634 and 641-644, respectively, may be made via an ideal conductive material with a thickness of about 10 microns. Package 650 may be substantially similar to package 600, but may comprise ACF 695 instead of the ideal conductive material. Package 650 may comprise bases 660 and 670, ground traces 681-682 and 691-692, and signal traces 683-684 and 693-694, which may be substantially similar to bases 610 and 620, ground traces 631-632 and 641-642, and signal traces 633-634 and 643-644. The couplings between traces 681-684 and 691-694, respectively, may be made via ACF 695.

Referring to FIGS. 7A-7B, graph 710 comprises the negative return loss of package couplings 600 and 650, respectively, over a plurality of frequencies and graph 720 comprises the negative insertion loss of package couplings 600 and 650, respectively, over a plurality of frequencies. As shown in graph 710 a return loss of package 650 that comprises ACF 695 may be comparable to a return loss of package 600 that comprises a coupling by an ideal conductive material. As shown in graph 710, package 650 may maintain a return loss of greater than about 19 dB while communicating signals of a frequency lower than about 30 GHz, which may be desirable as discussed above. As shown in graph 720, an insertion loss of package 650 that comprises ACF 695 may be comparable to an insertion loss of package 600 that comprises a coupling by an ideal conductive material. As shown in graph 720, package 650 may maintain an insertion loss between zero dB and about 0.3 dB while communicating signals of a frequency lower than about 30 GHz, which may be desirable as discussed above. As shown in FIGS. 5A-5B and 7A-7B, ACF may be effective for electrically coupling an opto-electronic package to a circuit and for communicating high frequency signals.

Figure 8:
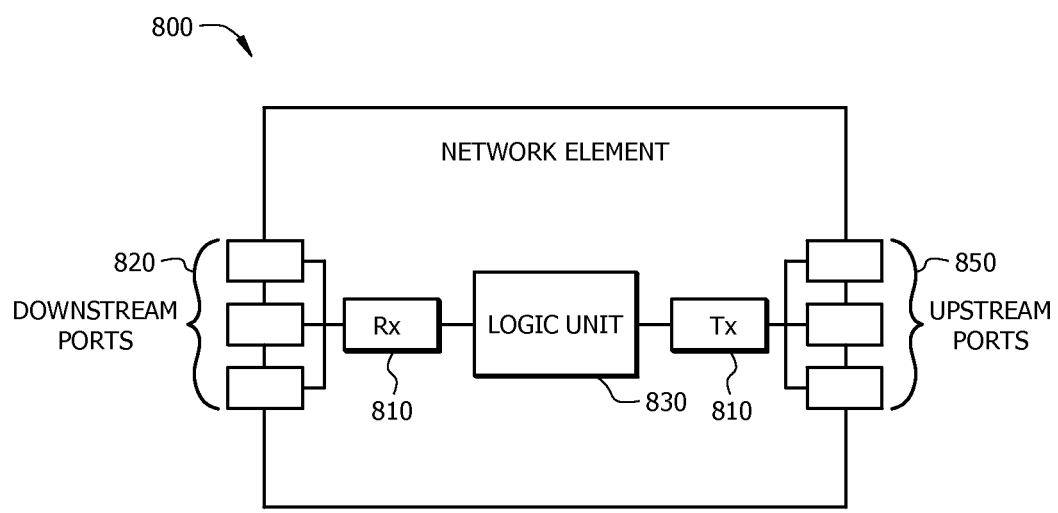
FIG. 8 is a schematic diagram of an embodiment of a network element.

FIG. 8 is a schematic diagram of an embodiment of a network element (NE) 800, which may function as a node in a network. One skilled in the art will recognize that the term NE encompasses a broad range of devices of which NE 800 is merely an example. NE 800 is included for purposes of clarity of discussion, but is in no way meant to limit the application of the present disclosure to a particular NE embodiment or class of NE embodiments. At least some of the features/methods described in the disclosure, for example opto-electronic package 112, circuit 130, package coupling 450, and/or package coupling 650 as well as method 200 may be implemented whole or in part in a network apparatus or component such as an NE 800. The NE 800 may be any device that transports frames through a network, e.g., a switch, router, bridge, server, etc. As shown in FIG. 8, the NE 800 may comprise transceivers (Tx/Rx) 810, which may be transmitters, a receiver, or combinations thereof. A Tx/Rx 810 may be coupled to plurality of downstream ports 820 for transmitting and/or receiving frames from other nodes, a Tx/Rx 810 coupled to plurality of upstream ports 850 for transmitting and/or receiving frames from other nodes, and a processor 830 coupled to the Tx/Rxs 810 to process the frames and/or determine which nodes to send frames to. The processor 830 may comprise one or more multi-core processors and/or memory devices, which may function as data stores. Processor 830 may be implemented as a general processor or may be part of one or more application specific integrated circuits (ASICs) and/or digital signal processors (DSPs). It should be noted that processor 830 is not required in all NE embodiments. The downstream ports 820 and/or upstream ports 850 may contain electrical and/or optical transmitting and/or receiving components, for example for example opto-electronic package 112, circuit 130, package coupling 450, and/or package coupling 650. NE 800 may or may not be a routing component that makes routing decisions.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, Rl, and an upper limit, Ru, is disclosed, any number falling within the range is specifically disclosed. In particular, the following numbers within the range are specifically disclosed: R=Rl+k*(Ru−Rl), wherein k is a variable ranging from 1 percent to 100 percent with a 1 percent increment, i.e., k is 1 percent, 2 percent, 3 percent, 4 percent, 7 percent, . . . , 70 percent, 71 percent, 72 percent, . . . , 97 percent, 96 percent, 97 percent, 98 percent, 99 percent, or 100 percent. Moreover, any numerical range defined by two R numbers as defined in the above is also specifically disclosed. The use of the term "about" means±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus comprising:
    an opto-electronic package comprising a plurality of first electrodes and a plurality of optical components, wherein the package is configured for transmission of optical and electrical signals;
    a circuit comprising a plurality of second electrodes;
    an anisotropic conductive film (ACF) compressed between at least a portion of the opto-electronic package and at least a portion of the circuit, wherein at least one of the first electrodes is mechanically coupled to at least one of the second electrodes via the ACF;
    a plurality of conductive traces are configured to connect the optical components and the first electrodes, wherein a first plurality of the conductive traces fan out in parallel in a first direction, a second plurality of the conductive traces fan out in parallel in a second direction, a third plurality of the conductive traces fan out in parallel in a third direction, a fourth plurality of the conductive traces fan out in parallel in a fourth direction, wherein the first direction, second direction, third direction and fourth direction are each different and the conductive traces comprise substantially similar lengths.

2. The apparatus of claim 1, wherein the ACF comprises a dielectric material and a plurality of conductive elements disposed in the dielectric material, and wherein the conductive elements each comprise a substantially spherical shape.

3. The apparatus of claim 2, wherein the conductive elements each have a diameter of about 10 microns.

4. The apparatus of claim 3, wherein the conductive elements each comprise gold.

5. The apparatus of claim 4, wherein the ACF comprises a conductive element density of about 800 conductive elements per square millimeter.

6. The apparatus of claim 5, wherein the conductive elements are substantially evenly distributed throughout the ACF.

7. The apparatus of claim 1, wherein the opto-electronic package is configured to communicate direct current electrical signals via the coupling.

8. An apparatus comprising:
    an opto-electronic package comprising a plurality of first electrodes and a receiver optical sub-assembly (ROSA) or a transmitter optical sub-assembly (TOSA);
    a circuit comprising a plurality of second electrodes;
    an anisotropic conductive film (ACF) compressed between at least a portion of the opto-electronic package and at least a portion of the circuit, wherein at least one of the first electrodes is mechanically coupled to at least one of the second electrodes via the ACF;
    a plurality of conductive traces are configured to connect the first electrodes and the ROSA or the TOSA, wherein a first plurality of the conductive traces fan out in parallel in a first direction, a second plurality of the conductive traces fan out in parallel in a second direction, a third plurality of the conductive traces fan out in parallel in a third direction, a fourth plurality of the conductive traces fan out in parallel in a fourth direction, wherein the first direction, second direction, third direction and fourth direction are each different and the conductive traces comprise substantially similar lengths.

9. The apparatus of claim 8, wherein the opto-electronic package comprises a pin pitch of about 10 micrometers (microns) to about 700 microns.

* * * * *